US011921139B2

United States Patent
Kim et al.

(10) Patent No.: US 11,921,139 B2
(45) Date of Patent: Mar. 5, 2024

(54) DIFFERENTIAL MODE CONVERTER, AND MEASURING DEVICE INCLUDING DIFFERENTIAL MODE CONVERTER

(71) Applicant: ULSAN NATIONAL INSTITUTE OF SCIENCE AND TECHNOLOGY, Ulsan (KR)

(72) Inventors: Jae Joon Kim, Ulsan (KR); Seungmok Kim, Ulsan (KR); Kyeong-Hwan Park, Ulsan (KR)

(73) Assignee: ULSAN NATIONAL INSTITUTE OF SCIENCE AND TECHNOLOGY, Ulsan (KR)

( * ) Notice: Subject to any disclaimer, the term of this patent is extended or adjusted under 35 U.S.C. 154(b) by 1092 days.

(21) Appl. No.: 16/655,696

(22) Filed: Oct. 17, 2019

(65) Prior Publication Data
US 2020/0052588 A1    Feb. 13, 2020

Related U.S. Application Data

(63) Continuation of application No. PCT/KR2017/012761, filed on Nov. 10, 2017.

(30) Foreign Application Priority Data

Apr. 19, 2017   (KR) .................... 10-2017-0050260

(51) Int. Cl.
*G01R 27/14* (2006.01)
*G01R 27/00* (2006.01)
(Continued)

(52) U.S. Cl.
CPC .............. *G01R 27/14* (2013.01); *G01R 27/00* (2013.01); *H03F 3/45179* (2013.01); *H03M 1/34* (2013.01); *H03M 3/04* (2013.01)

(58) Field of Classification Search
CPC ........ G01R 27/14; G01R 19/18; G01R 27/00; G01R 1/30; G01R 31/31706;
(Continued)

(56) References Cited

U.S. PATENT DOCUMENTS 8,237,489 B2 *   8/2012   Cheng .................. G01D 5/24
                                                        327/337
2010/0253368 A1 * 10/2010 Cheng .............. G01R 27/2605
                                                        324/658
(Continued)

FOREIGN PATENT DOCUMENTS

JP    2011-015248 A    1/2011
JP    2013-126141 A    6/2013
(Continued)

OTHER PUBLICATIONS

International Search Report dated Mar. 16, 2018 in corresponding International Application No. PCT/KR2017/012761; 5 pages.

*Primary Examiner* — Son T Le
(74) *Attorney, Agent, or Firm* — Maier & Maier, PLLC

(57) ABSTRACT

A differential mode converter that includes an input mode converter configured to convert an input voltage in a single-ended mode into a first differential voltage and a second differential voltage to be output, the first differential voltage and the second differential voltage being symmetric with respect to a reference voltage and having a form of a square wave; and a chopper configured to receive the first differential voltage and the second differential voltage and determine a first chopping voltage and a second chopping voltage based on the first differential voltage and the second differential voltage to output the first chopping voltage and the second chopping voltage, the first chopping voltage and the second chopping voltage being symmetric with respect to the reference voltage and having a form of a DC voltage.

19 Claims, 8 Drawing Sheets

(51) Int. Cl.
      *H03F 3/45*          (2006.01)
      *H03M 1/34*        (2006.01)
      *H03M 3/04*        (2006.01)

(58) Field of Classification Search
      CPC .......... H03F 3/45179; H03F 2200/261; H03F 2203/45138; H03F 3/45475; H03F 3/387; H03F 3/38; H03M 1/34; H03M 3/00; H03M 3/04; H03M 3/34; H03M 1/0656; H03M 1/12
      See application file for complete search history.

(56)           References Cited

U.S. PATENT DOCUMENTS

2016/0143591 A1\*   5/2016   Bracke ................ A61N 1/0488
                                                      600/373
2018/0055409 A1\*   3/2018   Xu ........................... H03F 3/45

FOREIGN PATENT DOCUMENTS

KR      10-1999-007064 A     1/1999
KR      10-2010-0041364 A    4/2010
KR          10-1620590 B1    5/2016

\* cited by examiner

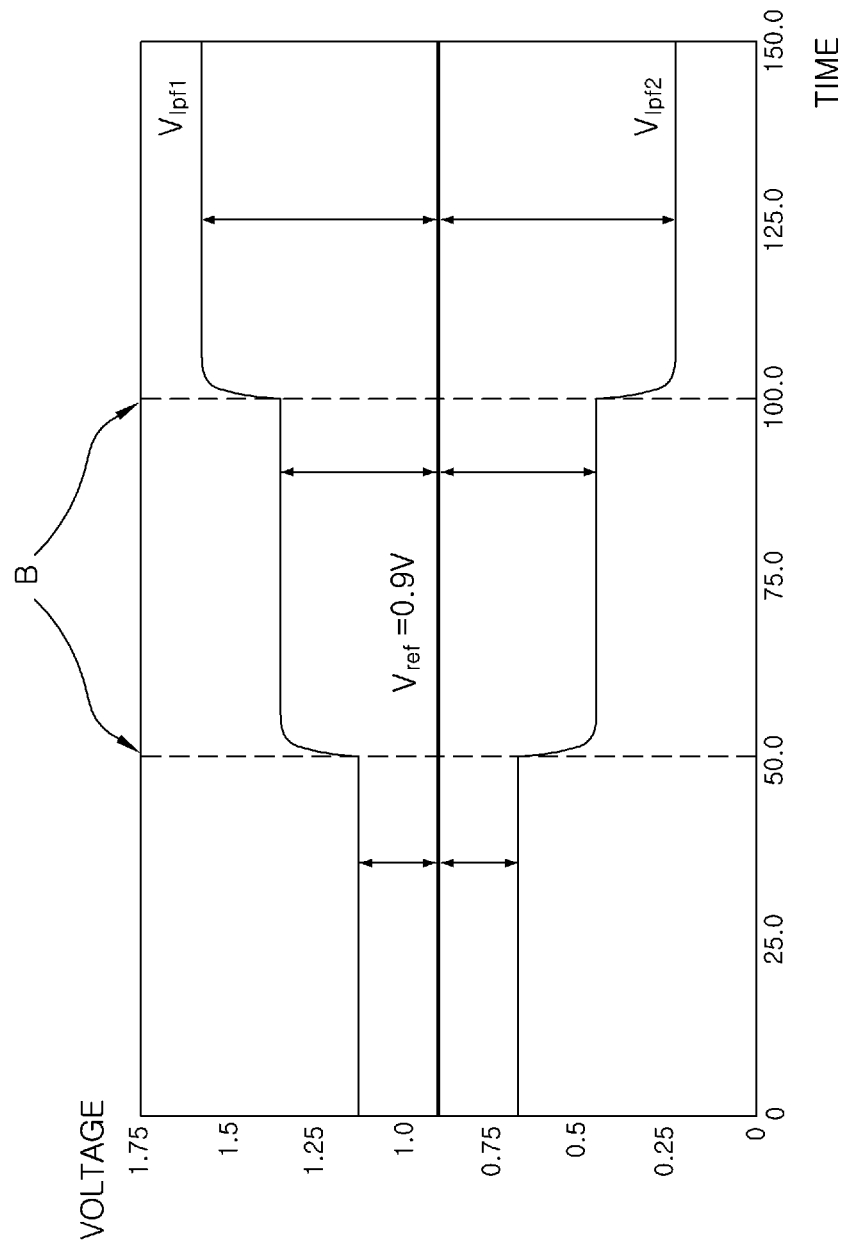

DIFFERENTIAL MODE CONVERTER, AND MEASURING DEVICE INCLUDING DIFFERENTIAL MODE CONVERTER

CROSS-REFERENCE TO RELATED APPLICATIONS

The present application is a continuation of International Patent Application No. PCT/KR2017/012761, filed on Nov. 10, 2017, which claims priority to and benefit of Korean Patent Application No. 10-2017-0050260, filed on Apr. 19, 2017. The disclosures of the above-listed applications are hereby incorporated by reference herein in their entirety.

FIELD

The present disclosure relates to a differential mode converter and a measuring device including the same.

BACKGROUND

In the field of electronic circuits associated with a measuring device such as a switching device and a resistance detector, research is progressed to minimize distortion of an input voltage signal and maximize accuracy of the input voltage signal.

There is a need for a technique to accurately obtain measurement information, such as a resistance value, by minimizing the noise and the offset voltage with respect to an inputted DC (direct current) voltage and up-modulating the DC input signal component only. The chopping in an electronic circuit is one of the principles of signal conversion technology studied due to such necessity.

However, since the chopper circuit, which is produced in accordance with the chopping operation principle, requires two differential inputs, there is a limit to practically apply the chopper circuit to the electronic devices requiring single-ended inputs, such as a medical equipment and a mobile phone.

SUMMARY

The present disclosure provides a differential mode converter capable of converting a voltage signal inputted in a single-ended input mode into a differential signal mode and applying it to a differential input signal of a chopper circuit.

Further, the present disclosure provides a measuring device including the differential mode converter capable of improving measuring accuracy and high resolution by converting the differential output signal of the chopper circuit into the analog-to-digital other than a differential mode converter capable of converting a power signal inputted in a single-ended input mode into a differential mode and applying it to a differential input signal of a chopper circuit.

In accordance with an aspect of the present disclosure, there is provided a differential mode converter comprising: an input mode converter configured to convert an input voltage input in a single-ended mode into a first differential voltage and a second differential voltage to be output, the first differential voltage and the second differential voltage being symmetric each other with respect to a reference voltage and having a form of a square wave; a chopper configured to receive the first differential voltage and the second differential voltage and determine a first chopping voltage and a second chopping voltage based on the first differential voltage and the second differential voltage to output the first chopping voltage and the second chopping voltage, the first chopping voltage and the second chopping voltage being symmetric with respect to the reference voltage and having a form of a DC voltage; and a low pass filter configured to receive the first chopping voltage and the second chopping voltage to output a first output voltage and a second output voltage with a minimized noise and offset.

In accordance with another aspect of the present disclosure, there is provided a measuring device comprising: an target resistance whose resistance value is to be measured; an input mode converter configured to convert an input voltage transmitted through the target resistance in a single-ended mode into a first differential voltage and a second differential voltage to be output, the first differential voltage and the second differential voltage are symmetric with respect to a reference voltage and have square wave forms; a chopper configured to receive the first differential voltage and the second differential voltage and determine a first chopping voltage and a second chopping voltage based on the first differential voltage and the second differential voltage to output the first chopping voltage and the second chopping voltage; a low pass filter configured to receive the first chopping voltage and the second chopping voltage to output a first output voltage ($V_{lpf1}$) and a second output voltage ($V_{lpf2}$) with a minimized noise and offset; and an analog-to-digital converter configured to perform an analog-to-digital conversion on the first output voltage and the second output voltage to output a digital signal corresponding to the resistance value of the target resistance.

With such configurations, by providing the differential mode converter capable of converting the single mode input into the differential mode and applying it as a differential input signal to the chopper circuit, it is possible to input the single-ended mode while maintaining the function of the chopper circuit which minimizes the noise and offset voltage.

Further, it is possible to improve measuring accuracy and resolution by converting an input signal in a single-ended mode into a differential mode and applying it as a differential input signal to the chopper circuit and performing an analog-to-digital conversion on the differential output signal of the chopper circuit passing through the low-pass filter.

BRIEF DESCRIPTION OF THE DRAWINGS

FIG. 4 shows an example of output waveforms ($V_{lpf1}$, $V_{lpf2}$) of a low pass filter in FIG. 1.

DETAILED DESCRIPTION

Advantages, features and methods for achieving them will become apparent from the embodiments which will be described later in detail with reference to the accompanying drawings. However, the present disclosure is not limited to the embodiments described herein below but implemented in many different forms. The embodiments are provided to make complete the present disclosure and to completely inform the scope of the present disclosure to those skilled in the art to which the present disclosure pertains. The present disclosure is defined only by the claims.

In describing the embodiments of the present disclosure, the detailed descriptions of well-known functions or configurations will be omitted if it is determined that the detailed descriptions of well-known functions or configurations unnecessarily make obscure the spirit of the present disclosure. The terms to be described later are defined in view of the functions exercised in the embodiments of the present disclosure and vary depending on the intention of a user or an operator and the practice. Thus, the definition of terms shall be made based on the overall contents of the subject specification.

In accordance with an embodiment of the present disclosure, there is provided a differential mode converter capable of converting a signal inputted in a single-ended mode into a differential mode and applying it as a differential input signal for a chopper circuit. Improved measuring accuracy and high resolution can be obtained by filtering a differential output signal of the chopper circuit through a low-pass filter and performing an analog-to-digital conversion. From this technical idea, the object of the present disclosure can be easily achieved.

Hereinafter, embodiments of the present disclosure will be described with reference to the accompanying drawings.

Figure 1:
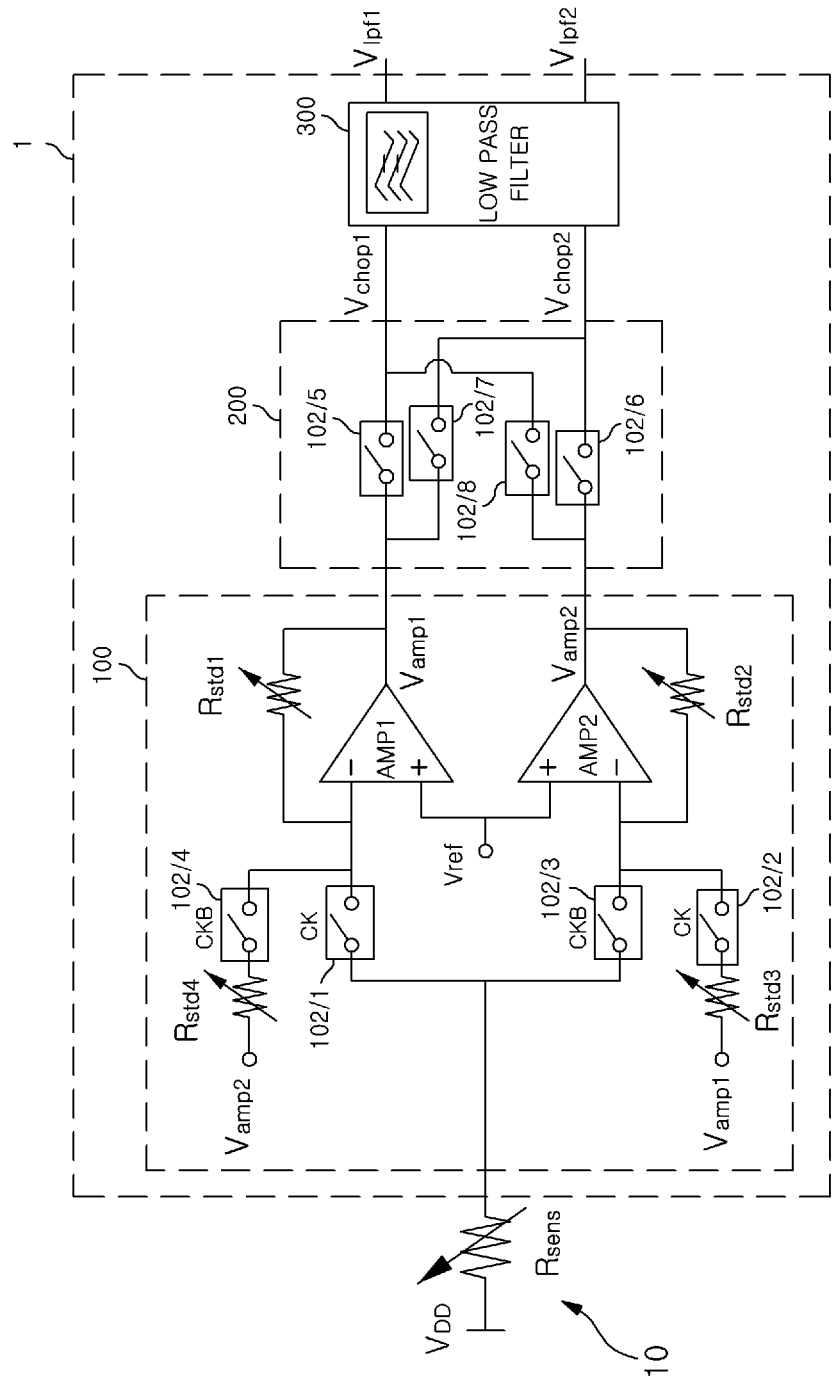
FIG. 1 is a diagram showing a differential mode converter according to an embodiment of the present disclosure.

FIG. 1 schematically illustrates a differential mode converter 1 in accordance with one embodiment of the present disclosure. As shown in FIG. 1, the differential mode converter 1 includes a target resistance $R_{sens}$, an input mode converter 100, a chopper 200 and a low pass filter 300.

As shown in FIG. 1, the target resistance $R_{sens}$ is a resistance element to measure a resistance value. One end of the target resistance is connected to an input voltage $V_{DD}$. The other end of the target resistance $R_{sens}$ is connected to respective ends of a first switch 102/1 and a third switch 102/3 of the input mode converter 100.

The input mode converter 100 serves to receive the input voltage $V_{DD}$ in a single-ended mode and convert it into a first differential voltage $V_{amp1}$ and a second differential voltage $V_{amp2}$ to be output, the first differential voltage $V_{amp1}$ and the second differential voltage $V_{amp2}$ having a form of a square wave and being symmetric with respect to a reference voltage $V_{ref}$.

The input mode converter 100 includes a first amplifier AMP1, a second amplifier AMP2, first to fourth switches 102/1, 102/2, 102/3 and 102/4 and first to fourth resistances $R_{std1}$, $R_{std2}$, $R_{std3}$ and $R_{std4}$.

The first amplifier AMP1 includes a first input terminal (inverting input terminal) to which a signal is inputted through a target resistance $R_{sens}$, a second input terminal (non-inverting input terminal) to which the reference voltage $V_{ref}$ is inputted and a first output terminal which outputs the first differential voltage $V_{amp1}$.

The second amplifier AMP1 includes a third input terminal (inverting input terminal) to which a signal is inputted through a target resistance $R_{sens}$, a fourth input terminal (non-inverting input terminal) to which the reference voltage $V_{ref}$ is inputted and a second output terminal to output the second differential voltage $V_{amp1}$.

The first and second amplifiers AMP1 and AMP2, for example, include an operational amplifier having two input terminals and one output terminal. However, it should be understood that various types of amplifiers for implementing an embodiment of the present disclosure can be employed as long as it is possible to implement two amplifiers each having two input terminals and one output terminal.

The first switch 102/1 has one end connected to the input voltage $V_{DD}$ through the target resistance $R_{sens}$, and the other end thereof is connected to the first input terminal of the first amplifier AMP1.

The second switch 102/2 has one end connected to the first output terminal of the first amplifier AMP1 and the other end thereof is connected to the third input terminal of the second amplifier AMP2.

The third switch 102/3 has one end connected to the input voltage $V_{DD}$ through the target resistance $R_{sens}$, and the other end thereof is connected to the third input terminal of the second amplifier AMP2.

The fourth switch 102/4 has one end connected to the second output terminal of the second amplifier AMP2 and the other end thereof is connected to the first input terminal of the first amplifier AMP1.

Figure 2A:
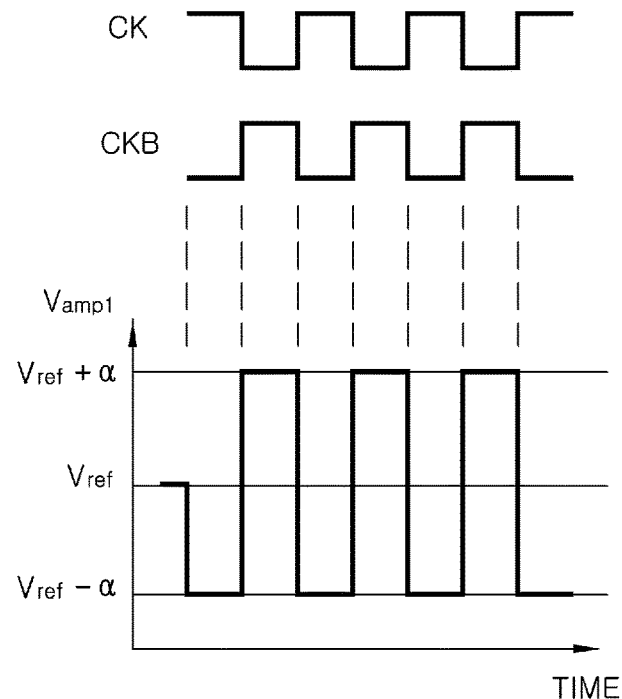
FIG. 2A shows an example of a waveform of a first differential voltage ($V_{amp1}$) of an input mode converter in FIG. 1.
Figure 2B:
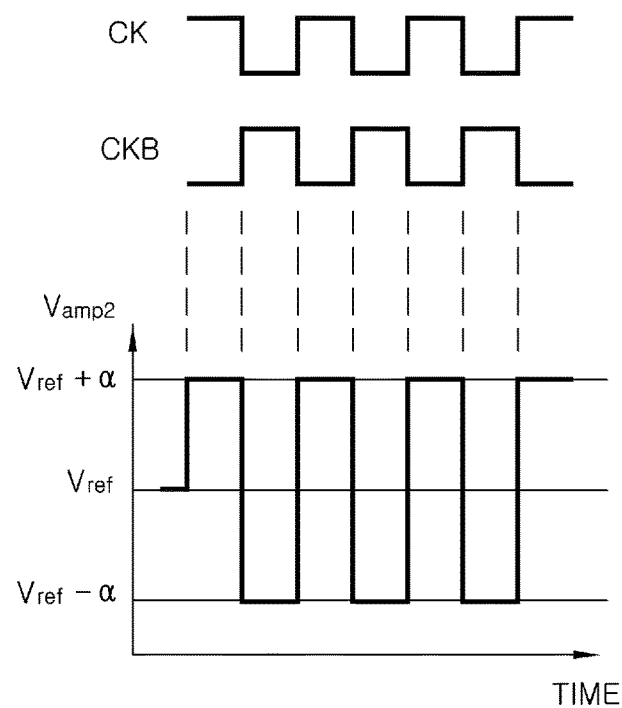
FIG. 2B shows an example of a waveform of a second differential voltage ($V_{amp2}$) of the input mode converter in FIG. 1.

Here, the first switch 102/1 and the second switch 102/2 are turned ON when the logic state of a first clock signal CK in FIGS. 2A and 2B is high. The third switch 102/3 and the fourth switch 102/4 are turned ON when the logic state of a second clock signal CKB in FIGS. 2A and 2B is high. Specifically, as shown in FIGS. 2A and 2B, when the logic state of the first clock signal CK is high, $V_{ref}-\alpha$ voltage of the first differential voltage $V_{amp1}$ is generated through the first switch 102/1, and $V_{ref}+\alpha$ voltage of the second differential voltage $V_{amp2}$ is generated through the second switch 102/2. The two differential voltages $V_{amp1}$ and $V_{amp2}$ are generated in the symmetrical forms to each other with respect to a reference voltage $V_{ref}$. On the other hand, when the logic state of the second clock signal CKB is high, $V_{ref}-\alpha$ voltage of the second differential voltage $V_{amp2}$ is generated through the third switch 102/3 and $V_{ref}+\alpha$ voltage of the first differential voltage $V_{amp1}$ is generated through the fourth switch 102/4. In this case, the two differential voltages $V_{amp1}$ and $V_{amp2}$ are kept symmetric with respect to the reference voltage $V_{ref}$ with the values thereof changed. The first clock signal CK and the second clock signal CKB always have the opposite logic states. Accordingly, the first switch 102/1 and the second switch 120/2 always have the opposite logic states to the third switch 102/3 and the fourth switch 102/4. The first clock signal CK and the second clock signal CKB are generated by a clock signal generator to be described later, and the operation process of the first switch 102/1, the second switch 102/2, the third switch 102/3 and the fourth switch 102/4 based on the clock signal of the clock signal generator will be described in detail with reference to FIGS. 6 and 7.

The first resistance $R_{std1}$ is disposed between the first input terminal and the first output terminal of the first amplifier AMP1, the second resistance $R_{std2}$ is disposed between the third input terminal and the second output terminal of the second amplifier AMP2. Furthermore, the third resistance $R_{std3}$ is disposed between the second switch 102/2 and the first output terminal of the amplifier AMP1, the fourth resistance $R_{std4}$ is disposed between the fourth switch 102/4 and the second output terminal of the second amplifier AMP2.

Here, the first resistance $R_{std1}$, the second resistance $R_{std2}$, the third resistance $R_{std3}$ and the fourth resistance $R_{std4}$ are the reference resistances having the same resistance value.

FIGS. 2A and 2B show an example of an output waveform of the input mode converter 100 in FIG. 1.

Specifically, FIG. 2A illustrates a waveform of the first differential voltage $V_{amp1}$ outputted from the first output terminal of the first amplifier AMP1 of the input mode converter 100. FIG. 2B illustrates a waveform of the second differential voltage $V_{amp2}$ outputted from the second output terminal of the second amplifier AMP2 of the input mode converter 100. Here, if the logic state of the clock signal CK, for example, is high, the second clock signal CKB is low which is opposite to the first clock signal CK.

As shown in FIGS. 2A and 2B, the first differential voltage $V_{amp1}$ and the second differential voltage $V_{amp2}$ are outputted in the square wave forms symmetrical to each other with respect to a reference voltage $V_{ref}$.

Referring back to FIG. 1, the chopper 200 of the differential mode converter 1 according to the embodiment of the present disclosure receives the first differential voltage $V_{amp1}$ and the second differential voltage $V_{amp2}$ from the input mode converter 100 and outputs the first chopping voltage $V_{chop1}$ and the second chopping voltage $V_{chop2}$ which have DC voltage forms symmetrical to each other with respect to a reference voltage $V_{ref}$.

As shown in FIG. 1, the chopper 200 includes an input terminal to which the first differential voltage $V_{amp1}$ is inputted, an input terminal to which the second differential voltage $V_{amp2}$ is inputted, an output terminals which outputs the first chopping voltage $V_{chop1}$, an output terminals which outputs the second chopping voltage $V_{chop2}$, and the fifth to eighth switches 102/5, 102/6, 102/7 and 102/8.

As shown in FIG. 1, one end of the fifth switch 102/5 is connected to the output terminal of the first differential voltage $V_{amp1}$ of the input mode converter 100, and the other end thereof outputs the first chopping voltage $V_{chop1}$.

One end of the sixth switch 102/6 is connected to the output terminal of the second differential voltage $V_{amp2}$ of the input mode converter 100, and the other end thereof outputs the second chopping voltage $V_{chop2}$.

One end of the seventh switch 102/7 is connected to the output terminal of the first differential voltage $V_{amp2}$ of the input mode converter 100, and the other end thereof outputs the second chopping voltage $V_{chop1}$.

One end of the eighth switch 102/8 is connected to the output terminal of the second differential voltage $V_{amp2}$ of the input mode converter 100, and the other end thereof outputs the first chopping voltage $V_{chop1}$.

Figure 3A:
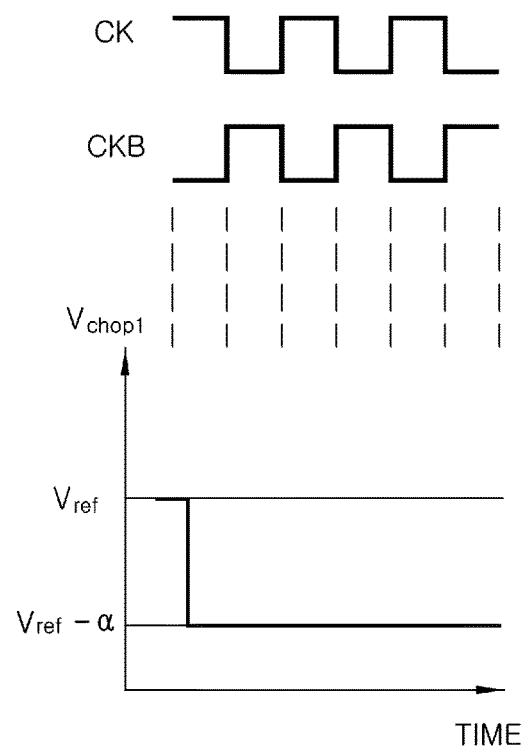
FIG. 3A shows an example of a waveform of a first chopping voltage ($V_{chop1}$) of a chopper in FIG. 1.
Figure 3B:
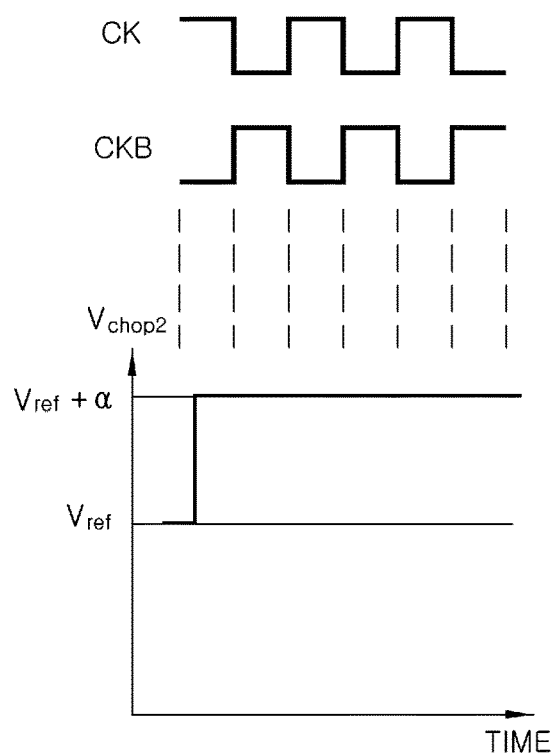
FIG. 3B shows an example of a waveform of the second chopping voltage ($V_{chop2}$) of the chopper in FIG. 1.

Here, the fifth switch 102/5 and the sixth switch 102/6 are turned ON when the logic state of the first clock signal CK is high, the seventh switch 102/7 and the eighth switch 102/8 are turned ON when the logic state of the second clock signal CKB is high. Specifically, when the logic state of the first clock signal CK is high, $V_{ref}-\alpha$ voltage of the first differential voltage $V_{amp1}$ is generated through the fifth switch 102/5 and $V_{ref}+\alpha$ voltage of the second differential voltage $V_{amp2}$ is generated through the sixth switch 102/6. In addition, when the logic state of the second clock signal CKB is high, $V_{ref}+\alpha$ voltage of the first differential voltage $V_{amp1}$ is generated through the seventh switch 102/7 and $V_{ref}-\alpha$ voltage of the second differential voltage $V_{amp2}$ is generated through the eighth switch 102/8. Accordingly, the first chopping voltage $V_{chop1}$ is maintained as $V_{ref}-\alpha$ voltage and the second chopping voltage $V_{chop2}$ is maintained as $V_{ref}+\alpha$ voltage regardless of high and low of the logic states of the first clock signal CK and the second clock signal CKB. Accordingly, the first chopping voltage $V_{chop1}$ outputted through the clock operation of the chopper 200 has the waveform as shown in FIG. 3A, and the second chopping voltage $V_{chop2}$ has the waveform as shown in FIG. 3B. The first clock signal CK and the second clock signal CKB of the chopper 200 are generated through the clock signal generator, these operation process of the fifth to eighth switches 102/5, 102/6, 102/7 and 102/8 in the chopper in accordance with the clock signals from the clock signal generator will be described in detail in FIGS. 6 and 7.

The low pass filter 300 serves to remove high frequency noise and offset of the first chopping voltage $V_{chop1}$ and the second chopping voltage $V_{chop2}$ outputted from the chopper 200.

In an actual environment, the complete DC voltages as shown in FIGS. 3A and 3B are not outputted, and high frequency noise and offset component are combined to generate a distorted waveform. Therefore, in the present embodiment, the low-pass filter unit 300 is added to the rear stage to remove high-frequency noise and offset.

FIG. 4 is a diagram illustrating a final output waveform after removing high frequency noise and offset through the low pass filter 300.

In FIG. 4, the reference voltage $V_{ref}$ is exemplified as 0.9V, and it can be seen that the voltages are outputted in the symmetrical form having the same difference in magnitude with respect to the reference voltage $V_{ref}$. At this time, the magnitude of the output voltage with respect to the reference voltage $V_{ref}$ varies depending on the values of the input voltage $V_{DD}$ and the target resistance $R_{sens}$. In FIG. 4, reference numeral B indicates points at which the magnitude of the output voltage is changed in accordance with the change in the resistance value of the target resistance $R_{sens}$.

Figure 5:
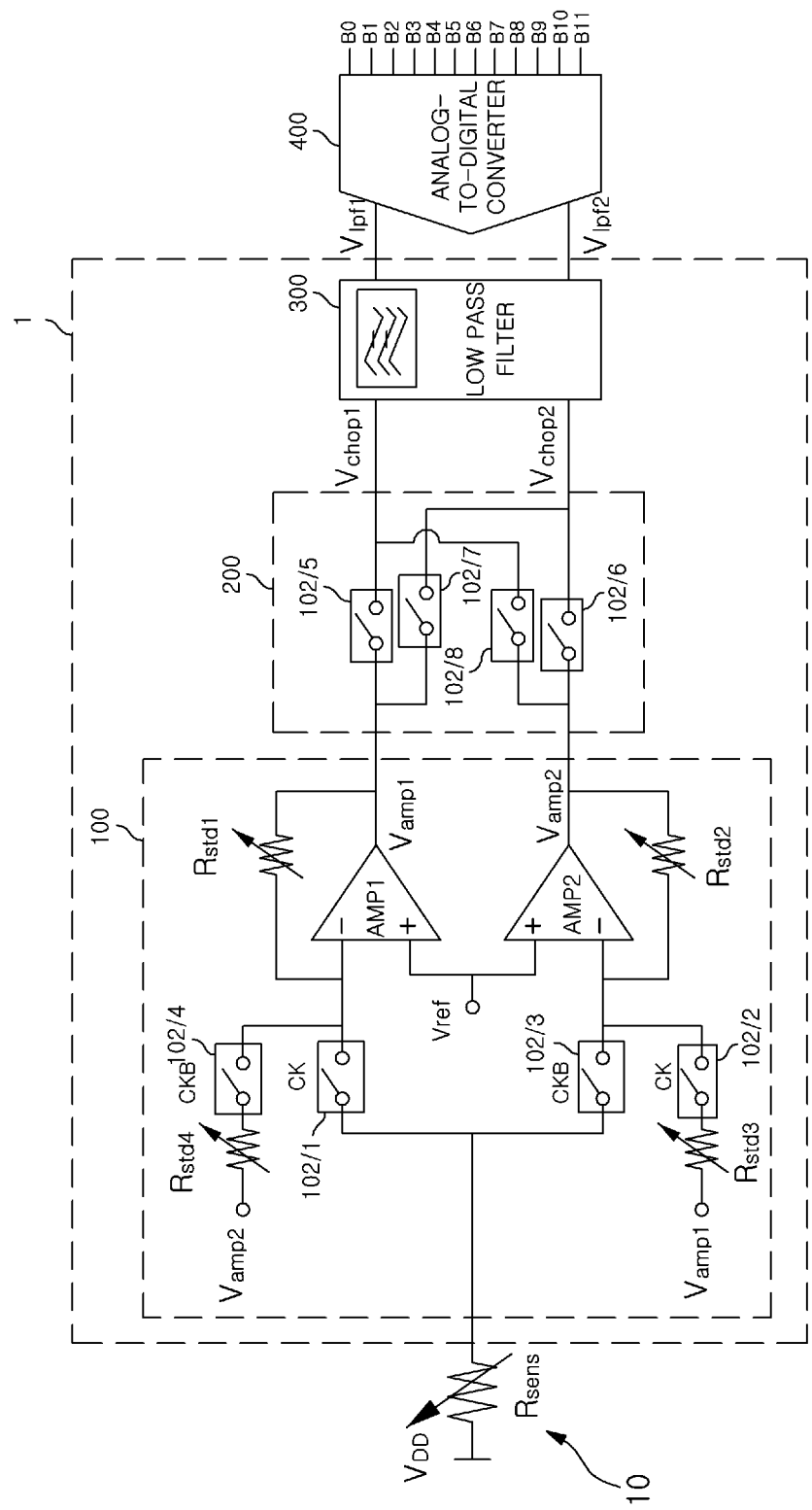
FIG. 5 shows a configuration of a measuring device using the differential mode converter according to another embodiment of the present disclosure.

FIG. 5 is a configuration diagram of the measuring device using the differential mode converter 1 according to an embodiment, the target resistance $R_{sens}$ and the analog-to-digital converter 400 are added to the differential mode converter shown in FIG. 1.

The target resistance $R_{sens}$ shown in FIG. 5 is a resistance element whose resistance value is intended to be measured by the measuring device in FIG. 5. One end of the target resistance $R_{sens}$ is connected to the input voltage $V_{DD}$ and the other end thereof is connected to one ends of the first switch 102/1 and the third switch 102/3 of the input mode converter 100.

The input mode converter 100 receives the input voltage $V_{DD}$ provided through the target resistance $R_{sens}$ in a single-ended mode and converts it into the first differential voltage $V_{amp1}$ and the second differential voltage $V_{amp2}$, which are symmetric with respect to the reference voltage $V_{ref}$ and have a square wave form, to be outputted.

The input mode converter 100 includes the first amplifier AMP1, the second amplifier AMP2, the first switch 102/1, the second switch 102/2, the third switch 102/3, the fourth switch 102/4 and the first to fourth resistance $R_{std1}$, $R_{std2}$, $R_{std3}$ and $R_{std4}$.

The first amplifier AMP1 includes the first input terminal (inverting input terminal) to which a signal is inputted through the target resistance $R_{sens}$, the second input terminal (non-inverting input terminal) to which the reference voltage $V_{ref}$ is inputted, and the first output terminal which outputs the first differential voltage $V_{amp1}$.

The second amplifier AMP2 includes the third input terminal (inverting input terminal) to which a signal is inputted through a target resistance $R_{sens}$, the fourth input terminal (non-inverting input terminal) to which the reference voltage $V_{ref}$ is inputted, and the second output terminal which outputs the second differential voltage $V_{amp2}$.

The first amplifier AMP1 and the second amplifier AMP2, for example, include an operational amplifier having two input terminals and one output terminal. However, it should be understood that various types of amplifiers for implementing an embodiment of the present disclosure can be employed as long as it is possible to implement two amplifiers each having two input terminals and one output terminal.

The first switch 102/1 has one end connected to the input voltage $V_{DD}$ through the target resistance $R_{sens}$, and the other end thereof is connected to the first input terminal of the first amplifier AMP1.

The second switch 102/2 has one end connected to the first output terminal of the first amplifier AMP1, and the other end thereof is connected to the third input terminal of the second amplifier AMP2.

The third switch 102/3 has one end connected to the input voltage $V_{DD}$ through the target resistance $R_{sens}$, and the other end thereof is connected to the third input terminal of the second amplifier AMP2.

The fourth switch 102/4 has one end connected to the second output terminal of the second amplifier AMP2, and the other end thereof is connected to the first input terminal of the first amplifier AMP1.

Here, as shown in FIGS. 2A and 2B, when the logic state of the first clock signal CK is high, $V_{ref}-\alpha$ voltage of the first differential voltage $V_{amp1}$ is generated through the first switch 102/1 and $V_{ref}+\alpha$ voltage of the second differential voltage $V_{amp2}$ is generated through the second switch 102/2. These two differential voltages $V_{amp1}$ and $V_{amp2}$ are generated in the symmetrical forms to each other with respect to a reference voltage $V_{ref}$. On the other hand, when the logic state of the second clock signal CKB is high, $V_{ref}-\alpha$ voltage of the second differential voltage $V_{amp2}$ is generated through the third switch 102/3 and $V_{ref}+\alpha$ voltage of the first differential voltage $V_{amp1}$ is generated through the fourth switch 102/4. In this case, the two differential voltages $V_{amp1}$ and $V_{amp2}$ are kept symmetric with respect to the reference voltage $V_{ref}$ with the values thereof changed. The first clock signal CK and the second clock signal CKB always have the opposite logic states. Accordingly, the logic states of the first switch 102/1 and the second switch 120/2 are always opposite to those of the third switch 102/3 and the fourth switch 102/4. In this regard, the first clock signal CK and the second clock signal CKB are generated by a clock signal generator to be described later. The operation process of the first switch 102/1, the second switch 102/2, the third switch 102/3 and the fourth 102/4 based on the clock signals of the clock signal generator will be described in detail in FIGS. 6 and 7.

The first resistance $R_{std1}$ is disposed between the first input terminal and the first output terminal of the first amplifier AMP1, the second resistance $R_{std2}$ is disposed between the third input terminal and the second output terminal of the second amplifier AMP2. Furthermore, the third resistance $R_{std3}$ is disposed between the second switch 102/2 and the first output terminal of the amplifier AMP1, the fourth resistance $R_{std4}$ is disposed between the fourth switch 102/4 and the second output terminal of the second amplifier AMP2.

Here, the first resistance $R_{std1}$, the second resistance $R_{std2}$, the third resistance $R_{std3}$ and the fourth resistance $R_{std4}$ are the reference resistances having the same resistance value.

FIGS. 2A and 2B show the examples of the output waveforms of the input mode converter 100 in FIG. 5.

Specifically, FIG. 2A illustrates a waveform of the first differential voltage $V_{amp1}$ outputted from the first output terminal of the first amplifier AMP1 of the input mode converter 100. FIG. 2B illustrates a waveform of the second differential voltage $V_{amp2}$ outputted from the second output terminal of the second amplifier AMP2 of the input mode converter 100. Here, if the logic state of the clock signal CK, for example, is high, the clock signal CKB is low which is opposite to the clock signal CK.

To obtain the output of the first differential voltage $V_{amp1}$, an equivalent circuit condition may be applied between the input voltage $V_{DD}$ and the first amplifier AMP1 and between the input voltage $V_{DD}$ and the second amplifier AMP2.

Figure 6:
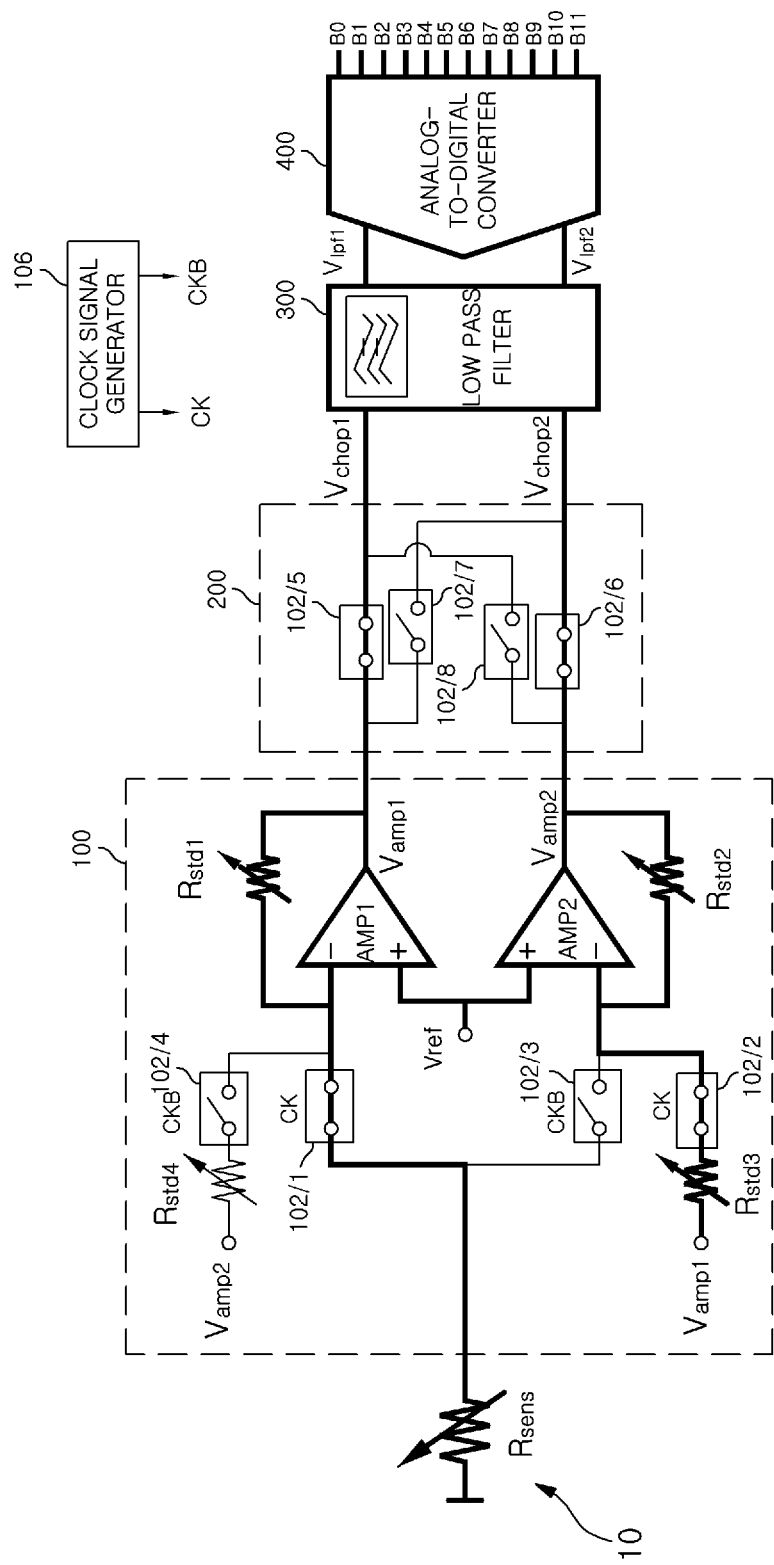
FIG. 6 is a diagram showing a process of an operation of a switch according to clock signals in the measuring device in FIG. 5.

FIG. 6 illustrates an operation process of the first to eighth switches 102/1 to 102/8 according to a clock signal and shows the example when the logic states of the first switch 102/1 and the second switch 102/2 are turned ON by the first clock signal CK whose logic state is high, and shows the example when the logic states of the third switch 102/3 and the fourth switch 102/4 are turned OFF by the second clock signal CKB whose logic state is low. The clock signal at this time is generated from the clock signal generator 106. The clock signal generator 106 may be included in the measuring device or separately provided outside the measuring device in the embodiment of the present disclosure and it should be understood that the configuration thereof can be selectively implemented.

If Kirchhoff's Current Law (KCL) is applied at the first inverting input terminal of the first amplifier AMP1, it can be expressed as the following Equation 1.

$$(V_{DD}-V_{ref})/R_{sens}=(V_{ref}-V_{amp1})/R_{std} \quad \text{[Equation 1]}$$

Therefore, when the first switch 102/1 and the second switch 102/2 are turned ON, the third switch 102/3 and the fourth switch 102/4 are turned OFF, the first differential voltage $V_{amp1}$ can be expressed as the following Equation 2.

$$V_{amp1}=V_{ref}-(R_{std}/R_{sens})(V_{DD}-V_{ref}) \quad \text{[Equation 2]}$$

Here, $V_{amp1}$ is the first differential voltage, $V_{ref}$ is a reference voltage, $R_{std}$ is the reference resistance, $R_{sens}$ is the target resistance, and $V_{DD}$ is the input voltage.

Further, in order to obtain the output of the second differential voltage $V_{amp2}$, an equivalent circuit condition can be applied between the input voltage $V_{DD}$ and the first amplifier AMP1 and between the input voltage $V_{DD}$ and the second amplifier AMP2, which can be expressed as the following Equation 3 by applying KCL at the second input terminal of the amplifier when the first switch 102/1 and the second switch 102/2 are turned on, and the third switch 102/3 and the fourth switch 102/4 are turned off.

$$(V_{amp1}-V_{ref})/R_{std}=(V_{ref}-V_{amp2})/R_{std} \quad \text{[Equation 3]}$$

Equation 2 can be substituted into Equation 3 and the second differential voltage $V_{amp2}$ can be expressed as the following Equation 4.

$$V_{amp2}=V_{ref}+(R_{std}/R_{sens})(V_{DD}-V_{ref}) \quad \text{[Equation 4]}$$

Figure 7:
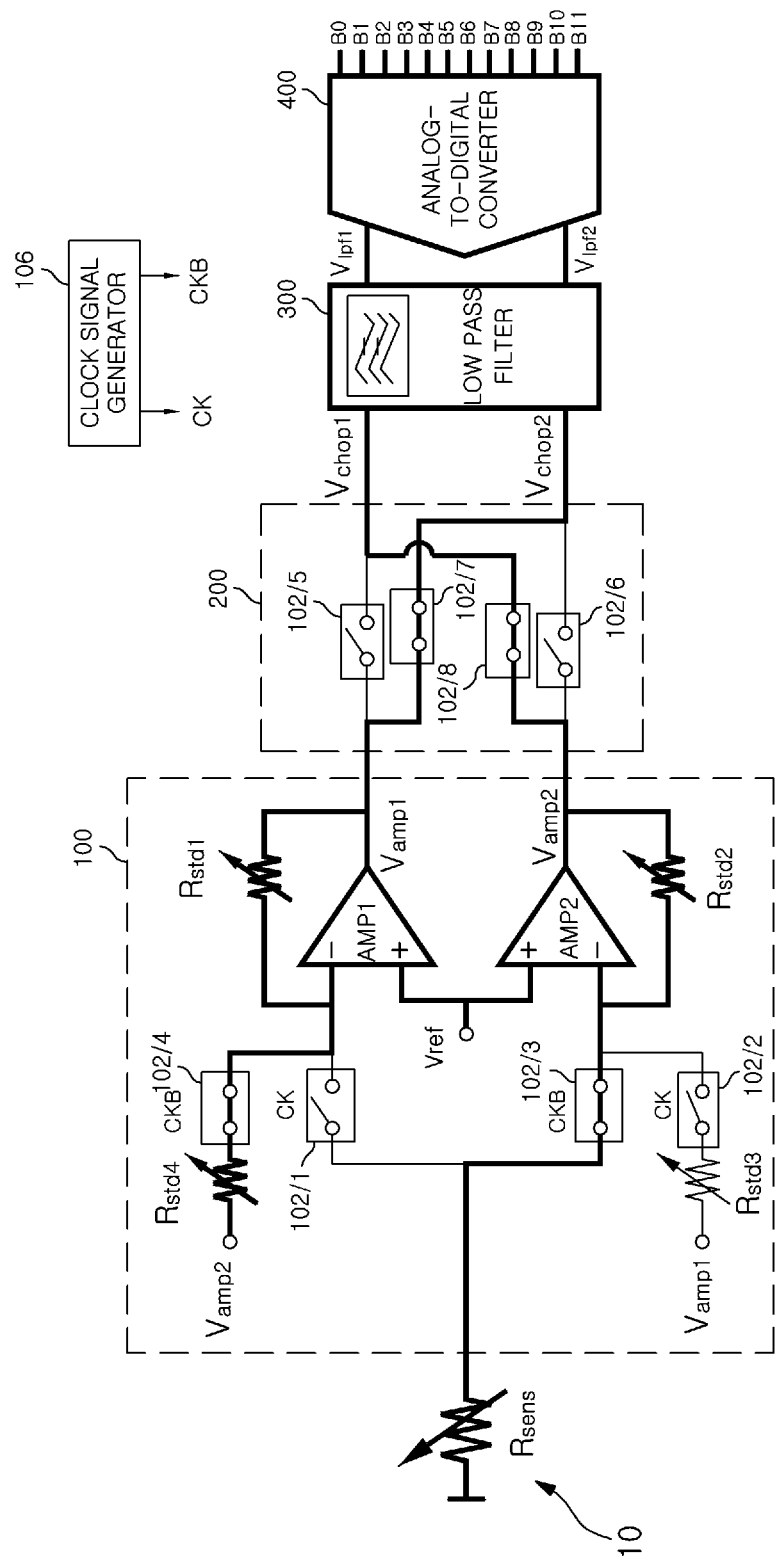
FIG. 7 is another diagram showing a process of an operation of a switch according to clock signals in the measuring device in FIG. 5.

On the other hand, as shown in FIG. 7, when the first switch 102/1 and the second switch 102/2 are turned OFF by the first clock signal CK whose logic state is low and the third switch 102/3 and the fourth switch 102/4 are turned ON by the second clock signal CKB, by applying KCL in the same way, the waveforms of the first differential voltage $V_{amp1}$ and the second differential voltage $V_{amp2}$ can be expressed as the following Equation 5 and Equation 6, respectively.

$$V_{amp1}=V_{ref}+(R_{std}/R_{sens})(V_{DD}-V_{ref})$$ [Equation 5]

$$V_{amp2}=V_{ref}-(R_{std}/R_{sens})(V_{DD}-V_{ref})$$ [Equation 6]

As shown in the above equations, and FIGS. 2A and 2B, the first differential voltage $V_{amp1}$ and the second differential voltage $V_{amp2}$ have square wave forms symmetrical to each other with respect to a reference voltage $V_{ref}$.

Referring back to FIG. 6, the chopper 200 in the differential mode converter 1 according to the embodiment of the present disclosure receives the first differential voltage $V_{amp1}$ and the second differential voltage $V_{amp2}$ from the input mode converter 100 and outputs the first chopping voltage $V_{chop1}$ and the second chopping voltage $V_{chop2}$ having DC voltage forms symmetrical to each other with respect to the reference voltage $V_{ref}$.

As shown in FIG. 3, the chopper 200 includes the input terminal to which the first differential voltage $V_{amp1}$ is inputted, the input terminal to which the second differential voltage $V_{amp2}$ is inputted, the output terminal which outputs the first chopping voltage $V_{chop1}$, the output terminal which outputs the second chopping voltage $V_{chop2}$, and the fifth to the eighth switch 102/5 to 102/8.

Since the description of the chopper 200 is the same as that described in the embodiment of FIG. 1, detailed descriptions of the embodiments of FIGS. 5 to 7 will be omitted.

The low pass filter 300 removes the high frequency noise and offset of the first chopping voltage $V_{chop1}$ and the second chopping voltage $V_{chop2}$ outputted from the chopper 200.

The first chopping voltage $V_{chop1}$ and the second chopping voltage $V_{chop2}$ from which the high-frequency noise and offset are removed in the low-pass filter unit 300 are the first output voltage $V_{lpf1}$ and the second output voltage $V_{lpf2}$ in the symmetrical forms and having the same difference in magnitude with respect to the reference voltage $V_{ref}$, and the first output voltage $V_{lpf1}$ and the second output voltage $V_{lpf2}$ are input signals of the analog-to-digital converter 400.

As shown in the waveform of FIG. 4, the difference in magnitude between the first output voltage $V_{lpf1}$ and the second output voltage $V_{lpf2}$, from which the high-frequency noise and offset are removed through the low-pass filter unit 300, with the reference voltage $V_{ref}$ centered, varies depending on the value of the input voltage $V_{DD}$ and the reference resistance $R_{std}$. As the value of the reference resistance $R_{std}$ is increased, the difference in magnitude between the output voltages is increased even with a small change in $R_{sens}$, which makes it easier for the analog-to-digital converter 400 to output the output voltage as digital bits to sense the resistance with higher resolution.

The analog-to-digital converter 400 outputs the digital signal corresponding to the resistance value of the target resistance 10 after analog-to-digital converting the first output voltage $V_{lpf1}$ and the second output voltage $V_{lpf2}$ provided from the low pass filter 300.

The analog-to-digital converter 400 includes an analog-to-digital converter having a predetermined bit resolution. For example, the analog-to-digital converter 400 includes a successive approximation resistor (SAR) analog-to-digital converter having a resolution of 12 bits.

If the analog-to-digital converter 400 has a resolution of 12 bits, the first output voltage $V_{lpf1}$ can be expressed as the following Equation 7.

$$V_{lpf1}=(V_{DD}/2^{12})*(2^{11}*D11+2^{10}*D10+2^9*D9+2^8*D8+2^7*D7+2^6*D6+2^5*D5+2^4*D4+2^3*D3+2^2*D2+2^1*D1+2^0*D0)$$ [Equation 7]

Since the first output voltage $V_{lpf1}$ can be obtained by Equation 2 except that noise and offset are removed from the first differential voltage $V_{amp1}$, the following Equation 8 can be obtained.

$$V_{lpf1}=V_{ref}-(R_{std}/R_{sens})(V_{DD}-V_{ref})$$ [Equation 8]

The resistance value $R_{sens}$ of the target resistance 10 can be found by substituting the respective variables into the Equation 8.

For example, assuming that the input voltage $V_{DD}$ is 1.8V, the reference voltage $V_{ref}$ is 0.9V, and the binary code of the analog-to-digital converter 400 having a 12-bit resolution is 010111010001, it can be expressed as the following Equation 9.

$$V_{lpf1}=(1.8/2^{12})*(2^{11}*0+2^{10}*1+2^9*0+2^8*1+2^7*1+2^6*1+2^5*0+2^4*1+2^3*0+2^2*0+2^1*0+2^0*1)=0.9-(R_{std}/R_{sens})(1.8-0.9)$$ [Equation 9]

The resistance value $R_{sens}$ of the target resistance 10 can be expressed by the following Equation 10 from the calculation of Equation 9.

$$R_{sens}=R_{std}(0.9)/(0.2456)$$ [Equation 10].

Assuming that the reference resistance $R_{std}$ in Equation 10 is 1 kΩ, the resistance value $R_{sens}$ of the target resistance 10 can be accurately measured to 3.66 kΩ.

Figure 8:
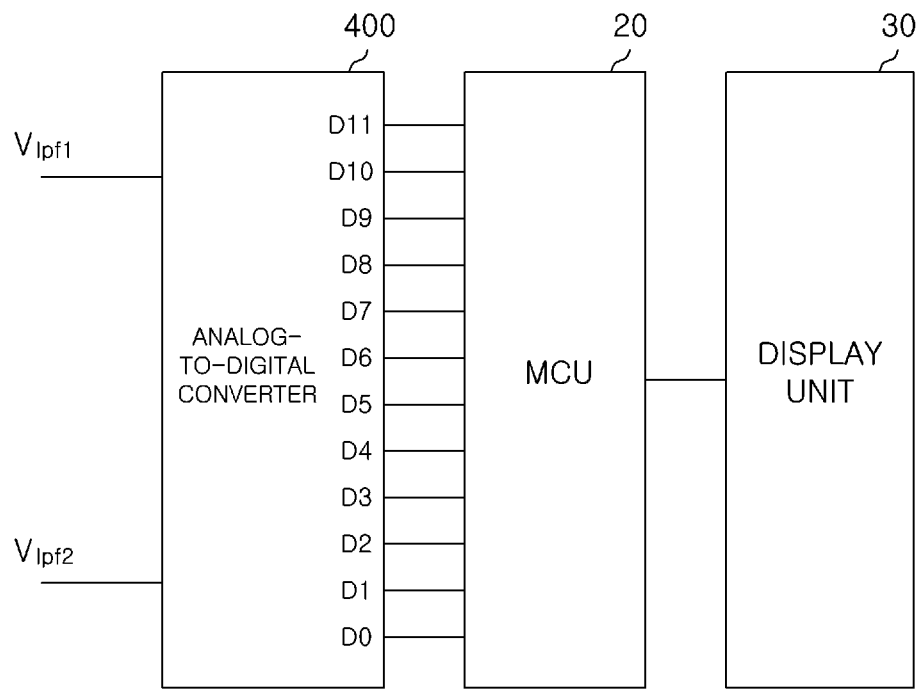
FIG. 8 is a diagram showing a system for measuring a resistance value from a digital bit output from an analog to digital converter in FIG. 5.

FIG. 8 is a system diagram for performing actual measurement through the measuring device in FIG. 5, which includes the micro controller (MCU) 20 connected to the analog-digital converter 400 and the display unit 30.

The microcontroller 20 receives the digital signal from the analog-to-digital converter 400 and processes the input digital signal to be displayed through the display unit 30. For example, the microcontroller 20 can execute a process so that the resistance value $R_{sens}$ of the target resistance 10, 3.66 kΩ, is accurately displayed through the display unit 30. In the microcontroller 20, a separate memory such as a flash memory or an EEPROM (Electrically Erasable Programmable Read Only Memory) is incorporated.

The display unit 30 can display the resistance value $R_{sens}$ of the target resistance 10, for example, the resistance value of 3.66 kΩ under the control of the microcontroller 20. For example, the display unit 30 includes any one of display devices such as a light emitting diode (LED) and a liquid crystal display (LCD).

According to the present embodiment as described above, by providing the differential mode converter 1 capable of converting the single mode input into the differential mode and applying it as a differential input signal for a chopper circuit, it is possible to input the single-ended mode while maintaining the function of the chopper circuit which minimizes the noise and offset voltage. Further, it is possible to improve measuring accuracy and resolution by converting an input signal in a single-ended mode into a differential mode and applying it as a differential input signal to the chopper circuit and performing an analog-to-digital conversion on the differential output signal of the chopper circuit passing through the low-pass filter.

What is claimed is:
1. A differential mode converter comprising:
    an input mode converter configured to convert an input voltage input in a single-ended mode into a first differential voltage and a second differential voltage to be output based upon a first clock signal and a second clock signal, wherein the input mode converter further comprises:

a first amplifier comprising:
- a first input terminal to which a signal is inputted through a target resistance,
- a second input terminal to which the reference voltage is inputted,
- a first output terminal which outputs the first differential voltage;

a second amplifier comprising:
- a third input terminal to which a signal is inputted through the target resistance,
- a fourth input terminal to which the reference voltage is inputted, and
- a second output terminal which outputs the second differential voltage, the first clock signal and the second clock signal have opposite logic states, and the first differential voltage and the second differential voltage are symmetric with respect to a reference voltage and have a form of a square wave; and a chopper configured to receive the first differential voltage and the second differential voltage, wherein a first chopping voltage and a second chopping voltage are based on the first differential voltage and the second differential voltage to output the first chopping voltage and the second chopping voltage, and the first chopping voltage and the second chopping voltage are symmetric with respect to the reference voltage and have a DC voltage.

2. The differential mode converter of claim 1, further comprising:
a low pass filter configured to remove high frequency noise and offset of the first chopping voltage and the second chopping voltage.

3. The differential mode converter of claim 1, wherein the input mode converter comprises:
- a first switch having one end connected to the input voltage, the other end of the first switch being connected to the first input terminal of the first amplifier;
- a second switch having one end connected to the first output terminal of the first amplifier, the other end of the second switch being connected to the third input terminal of the second amplifier;
- a third switch having one end connected to the input voltage, the other end of the third switch being connected to the third input terminal of the second amplifier; and
- a fourth switch having one end connected to the second output terminal of the second amplifier, the other end of the fourth switch being connected to the first input terminal of the first amplifier.

4. The differential mode converter of claim 3, wherein the first clock signal and the second clock signal are generated from a clock signal generator disposed outside the differential mode converter, the first clock signal and the second clock signal having a form of a square wave,
the first switch and the second switch are turned ON when the logic state of the first clock signal is high, and
the third switch and the fourth switch are turned ON when the logic state of the second clock signal is high.

5. The differential mode converter of claim 4, wherein the input mode converter further comprises:
a first resistance disposed between the first input terminal and the first output terminal of the first amplifier;
a second resistance disposed between the third input terminal and the second output terminal of the second amplifier;
a third resistance disposed between the second switch and the first output terminal of the first amplifier; and
a fourth resistance disposed between the fourth switch and the second output terminal of the second amplifier.

6. The differential mode converter of claim 5, wherein the first resistance, the second resistance, the third resistance and the fourth resistance have a same resistance value.

7. The differential mode converter of claim 1, wherein the chopper comprises:
- an input terminal to which the first differential voltage is inputted;
- an input terminal to which the second differential voltage is inputted;
- an output terminal which outputs the first chopping voltage;
- an output terminal which outputs the second chopping voltage;
- a fifth switch having one end connected to the input terminal to which the first differential voltage is inputted, the other end of the fifth switch being connected to the output terminal which outputs the first chopping voltage;
- a sixth switch having one end connected to the input terminal to which the second differential voltage is inputted, the other end of the sixth switch being connected to the output terminal which outputs the second chopping voltage;
- a seventh switch having one end connected to the input terminal to which the first differential voltage is inputted, the other end of the seventh switch being connected to the output terminal which outputs the second chopping voltage; and
- an eighth switch having one end connected to the input terminal to which the second differential voltage is inputted, the other end of the eighth switch being connected to the output terminal which outputs the first chopping voltage.

8. The differential mode converter of claim 7, wherein the first clock signal and the second clock signal are generated from a clock signal generator disposed outside the differential mode converter, the first clock signal and the second clock signal having a form of a square wave,
the fifth switch and the sixth switch are turned ON when the logic state of the first clock signal is high, and
the seventh switch and the eighth switch are turned ON when the logic state of the second clock signal is high.

9. A measuring device comprising:
a target resistance whose resistance value is to be measured;
an input mode converter configured to convert an input voltage transmitted through the target resistance in a single-ended mode into a first differential voltage and a second differential voltage to be output based upon a first clock signal and a second clock signal, wherein the input mode converter further comprises: a first amplifier comprising:
a first input terminal to which a signal is inputted through a target resistance,
a second input terminal to which the reference voltage is inputted,
a first output terminal which outputs the first differential voltage;

a second amplifier comprising:
  a third input terminal to which a signal is inputted through the target resistance,
  a fourth input terminal to which the reference voltage is inputted, and
  a second output terminal which outputs the second differential voltage, the first clock signal and the second clock signal have opposite logic states, and the first differential voltage and the second differential voltage are symmetric with respect to a reference voltage and have a form of a square wave;
  a chopper configured to receive the first differential voltage and the second differential voltage, wherein a first chopping voltage and a second chopping voltage are based on the first differential voltage and the second differential voltage to output the first chopping voltage and the second chopping voltage, and the first chopping voltage and the second chopping voltage are symmetric with respect to the reference voltage and have a DC voltage; and
  an analog-to-digital converter configured to perform an analog-to-digital conversion on the first output voltage and the second output voltage to output a digital signal based on the resistance value of the target resistance.

10. The measuring device of claim 9, further comprising:
a low pass filter configured to remove high frequency noise and offset of the first chopping voltage and the second chopping voltage, and provide the first output voltage and the second output voltage to the analog-digital converter without the high frequency noise and offset.

11. The measuring device of claim 9, wherein the input mode further converter comprises:
  a first switch having one end connected to the input voltage, the other end of the first switch being connected to the first input terminal of the first amplifier;
  a second switch having one end connected to the first output terminal of the first amplifier, the other end of the second switch being connected to the third input terminal of the second amplifier;
  a third switch having one end connected to the input voltage, the other end of the third switch being connected to the third input terminal of the second amplifier; and
  a fourth switch having one end connected to the second output terminal of the second amplifier, the other end of the fourth switch being connected to the first input terminal of the first amplifier.

12. The measuring device of claim 11, wherein the first clock signal and the second clock signal are generated from a clock signal generator disposed outside the differential mode converter, the first clock signal and the second clock signal having a form of a square wave,
  the first switch and the second switch are turned ON when the logic state of the first clock signal is high, and
  the third switch and the fourth switch are turned ON when the logic state of the second clock signal is high.

13. The measuring device of claim 12, wherein an input mode converter further comprises:
  a first resistance disposed between the first input terminal and the first output terminal of the first amplifier;
  a second resistance disposed between the third input terminal and the second output terminal of the second amplifier;
  a third resistance disposed between the second switch and the first output terminal of the first amplifier; and
  a fourth resistance disposed between the fourth switch and the second output terminal of the second amplifier.

14. The measuring device of claim 13, wherein the target resistance has one end connected to the first switch and the third switch.

15. The measuring device of claim 13, wherein the first resistance, the second resistance, the third resistance and the fourth resistance have a same resistance value.

16. The measuring device of claim 15, wherein when the first clock signal is high and the second clock signal is low, the first differential voltage and the second differential voltage are expressed as an equation of $V_{amp1}=V_{ref}-(R_{std}/R_{sens})(V_{DD}-V_{ref})$ and an equation of $V_{amp2}=V_{ref}+(R_{std}/R_{sens})(V_{DD}-V_{ref})$, respectively,
  wherein when the second clock signal is high and the first clock signal is low, the first differential voltage and the second differential voltage are expressed as an equation of $V_{amp1}=V_{ref}+(R_{std}/R_{sens})(V_{DD}-V_{ref})$ and an equation of $V_{amp2}=V_{ref}-(R_{std}/R_{sens})(V_{DD}-V_{ref})$, respectively, and
  wherein the $V_{amp1}$ represents the first differential voltage, the $V_{amp2}$ represents the second differential voltage, the $V_{ref}$ represents the reference voltage, the $R_{std}$ represents the first resistance, the second resistance, the third resistance or the fourth resistance, and the $R_{sens}$ represents the target resistance and the $V_{DD}$ represents the input voltage.

17. The measuring device of claim 9, wherein the chopper comprises:
  an input terminal to which the first differential voltage is inputted;
  an input terminal to which the second differential voltage is inputted;
  an output terminal which outputs the first chopping voltage;
  an output terminal which outputs the second chopping voltage;
  a fifth switch having one end connected to the input terminal to which the first differential voltage is inputted, the other end of the fifth switch being connected to the output terminal which outputs the first chopping voltage;
  a sixth switch having one end connected to the input terminal to which the second differential voltage is inputted, the other end of the sixth switch being connected to the output terminal which outputs the second chopping voltage;
  a seventh switch having one end connected to the input terminal to which the first differential voltage is inputted, the other end of the seventh switch being connected to the output terminal which outputs the second chopping voltage; and
  an eighth switch having one end connected to the input terminal to which the second differential voltage is inputted, the other end of the eighth switch being connected to the output terminal which outputs the first chopping voltage.

18. The measuring device of claim 17, further comprising:
  a clock signal generator configured to generate the first clock signal and the second clock signal, the first clock signal and the second clock signal having a form of a square wave,
  wherein the fifth switch and the sixth switch are turned ON when the logic state of the first clock signal is high, and wherein the seventh switch and the eighth switch are turned ON when the logic state of the second clock signal is high.

19. The measuring device of claim 9, further comprising:
a microcontroller configured to execute a process for displaying the digital signal outputted from the analog-to-digital converter.

\* \* \* \* \*